United States Patent [19]

Hong

[11] Patent Number: 5,675,162
[45] Date of Patent: Oct. 7, 1997

[54] EPROM, FLASH MEMORY WITH HIGH COUPLING RATIO

[75] Inventor: Gary Hong, Hsin-chu, Taiwan

[73] Assignee: United Microelectronics Corporation, Hsin-chu, Taiwan

[21] Appl. No.: 641,411

[22] Filed: Apr. 30, 1996

Related U.S. Application Data

[60] Continuation of Ser. No. 445,934, May 22, 1995, abandoned, which is a division of Ser. No. 238,873, May 6, 1994, Pat. No. 5,432,112.

[51] Int. Cl.$^6$ ................................................ H01L 29/788
[52] U.S. Cl. .......................... 257/316; 257/317; 257/324; 257/760; 365/185.1
[58] Field of Search ........................... 257/316, 315, 257/317, 314, 324, 760; 365/185.1

[56] References Cited

U.S. PATENT DOCUMENTS

| | | | |
|---|---|---|---|
| 4,812,885 | 3/1989 | Riemenschneider | 257/316 |
| 5,089,867 | 2/1992 | Lee | 257/316 |
| 5,225,362 | 7/1993 | Bergemont | 365/185.02 |
| 5,281,548 | 1/1994 | Prall | 257/315 |
| 5,293,331 | 3/1994 | Hart et al. | 257/346 |
| 5,379,253 | 1/1995 | Bergemont | 257/315 |
| 5,381,028 | 1/1995 | Iwasa | 257/316 |
| 5,389,808 | 2/1995 | Arai | 257/316 |
| 5,434,813 | 7/1995 | Tamura et al. | 257/316 |
| 5,453,393 | 9/1995 | Bergemont | 437/52 |

Primary Examiner—Tom Thomas
Assistant Examiner—David B. Hardy
Attorney, Agent, or Firm—William H. Wright

[57] ABSTRACT

A semiconductor device is formed on a substrate lightly doped with a dopant, a source region and a drain region in the substrate on the surface thereof, a dielectric layer deposited upon the substrate, a first floating gate layer formed on the dielectric layer, a second floating gate layer formed on the the first floating gate layer, a second dielectric material deposited upon the surface of the first floating gate electrode, a control gate electrode deposited upon the surface of the additional dielectric material, and means for applying a voltage to the control gate electrode.

11 Claims, 5 Drawing Sheets

EPROM, FLASH MEMORY WITH HIGH COUPLING RATIO

This is a continuation of application Ser. No. 08/445,934, filed May 22, 1995, now abandoned, which was a divisional of application Ser. No. 08/238,873, filed May 6, 1994, now U.S. Pat. No. 5,432,112.

BACKGROUND OF THE INVENTION

1. Field of the Invention

This invention relates to EPROM, flash memory cells and more particularly to high coupling ratio devices and methods of manufacture thereof.

2. Description of Related Art

U.S. Pat. No. 5,089,867 describes increasing the coupling ratio by texturizing the polysilicon 1 surface.

FIG. 1 is a plan view of a prior art device 10 with several polysilicon 1 floating gate lines FG1, FG2, FG3, and FG4 parallel polysilicon 2 word lines 20 and 20' forming control gates. The floating gate lines FG1 and FG2 are located beneath polysilicon 2 word line 20 and are separated by distance "d". The minimum value of "d" is limited by the design rule. The polysilicon 1/polysilicon 1 spacing "d" is minimum based on the design rule. For example, "d" is about 0.6 μm for a 0.6 μm process for producing a product with that scale. The floating gate lines FG3 and FG4 are located beneath polysilicon 2 word line 20'. A number of contacts X1, X2, X3, and X4 are shown adjacent to the floating gate lines FG1, FG2, FG3, and FG4 in the drain regions. The contacts X1, X2, X3, and X4 connect between drain regions and metal. The source S and the drain D are indicated near the floating gate FG4.

FIG. 2 shows a cross section of the prior art device of FIG. 1 taken along line 2—2 in FIG. 1. The source region S and drain region D are shown as N+ doped regions in the P-sub 11. Above those elements is the tunneling oxide layer 12 having a thickness of about 100 Å. The polysilicon floating gate FG3 is shown on tunneling oxide layer 12. The next layer is interpolysilicon ONO layer 16 upon which is formed the polysilicon 2 layer 20, which serves as the control gate.

FIG. 3 shows a cross section of the device 10 of FIG. 1 taken along line 3—3 in FIG. 1. The P-sub 11 is covered by the tunneling oxide layers 12 and 12' beneath the polysilicon 1 floating gate structures FG3 and FG4. Between the tunneling oxide layer sections 12 and 12' are located FOX regions 13.

Above the floating gate structures FG3 and FG4, is the interpolysilicon layer 16. Above the interpolysilicon layer 16 is a polysilicon 2 control gate layer 20'.

SUMMARY OF THE INVENTION

This invention is concerned with a process for formation of an EPROM or Flash memory cell with higher control gate/floating gate coupling, with, in turn, resulting improved programmability, high read current, smaller cell size or better erasure speed (Flash E2PROM.)

In accordance with this invention, a semiconductor device is formed on a substrate lightly doped with a dopant, a source region and a drain region in the substrate on the surface thereof, a dielectric layer deposited upon the substrate, a first floating gate layer formed on the dielectric layer, a second floating gate layer formed on the the first floating gate layer, a second dielectric material deposited upon the surface of the first floating gate electrode, a control gate electrode deposited upon the surface of the additional dielectric material, and means for applying a voltage to the control gate electrode.

Preferably, with the second floating gate layer is formed on the the first floating gate layer providing a spacer structure providing a spacing of d between floating gates; the first dielectric layer comprises a thin silicon oxide layer and FOX structures; the second dielectric material comprises ONO material having a thickness within a range from about 150 Å to about 300 Å; the floating gate layers comprise doped layers of polysilicon; the first floating gate layer has a thickness within a range from about 1500 Å to about 5,000 Å; and the second floating gate layer has a thickness within a range from about 1,000 Å to about 4,000 Å.

In accordance with another aspect of this invention, a flash memory cell device is formed on a semiconductor substrate, including a source, a drain, and a first dielectric layer deposited upon the substrate, a first floating gate electrode formed on the dielectric layer. The device is formed by the method comprising forming a second floating gate electrode layer on the surface of the first floating gate electrode, forming a second dielectric layer upon the surface of the first and second floating gate electrode layers, and forming a control gate electrode layer on the surface of the second dielectric layer.

Preferably, the first floating gate electrode layer is formed by deposition of about 1,500 Å of polysilicon, a silicon nitride layer is formed upon the first floating gate electrode layer and patterned to form a mask for the second gate electrode layer; the second dielectric material comprises ONO material having a thickness within a range from about 150 Å to about 300 Å; the first floating gate electrode layer is formed by deposition of about 1,500 Å of polysilicon; a silicon nitride layer is formed upon the first floating gate electrode layer and patterned to form a mask for the second gate electrode layer; the first floating gate layer has a thickness within a range from about 1500 Å to about 4,000 Å; the second floating gate layer has a thickness within a range from about 1,000 Å to about 4,000 Å.

BRIEF DESCRIPTION OF THE DRAWINGS

The foregoing and other aspects and advantages of this invention are explained and described below with reference to the accompanying drawings, in which.

DESCRIPTION OF THE PREFERRED EMBODIMENT

Figure 4:
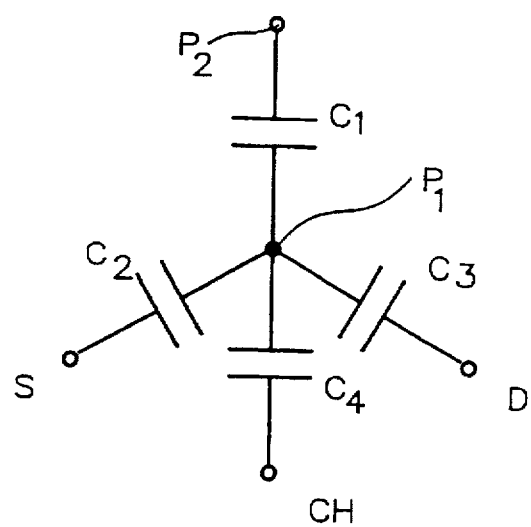
FIG. 4 is an electrical schematic diagram of an embodiment of this invention is shown including polysilicon 2 control gate connected through a capacitor to the polysilicon 1 floating gate which is connected to additional capacitors.

Referring to FIG. 4, an electrical schematic diagram of an embodiment of this invention is shown including polysilicon 2 control gate P2 is connected through capacitor $C_1$ to the polysilicon 1 floating gate P1, which is connected to capacitors $C_2$, $C_3$ and $C_4$. Capacitor $C_2$ is connected to the source S, capacitor $C_3$ is connected to the drain D, and capacitor $C_4$ is connected to the channel CH.

$$\text{Coupling Ratio } (CR) = \frac{C_1}{C_1 + C_2 + C_3 + C_4}$$

The coupling ratio CR can be increased by increasing the capacitance $C_1$.

Process

A process for making an EPROM, Flash memory with high coupling ratio device 40 is described with reference to FIGS. 5–10.

Figure 5:
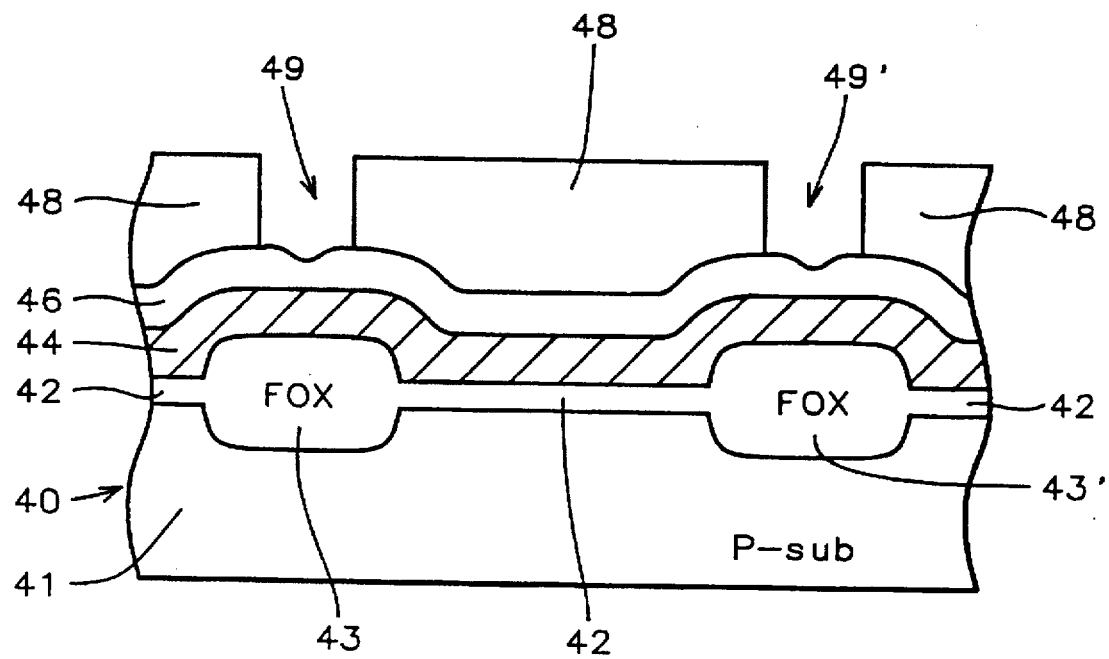
FIG. 5 is a cross section of a device being formed on an integrated circuit semiconductor substrate, in accordance with this invention.

FIG. 5 is a cross section of a device being formed on an integrated circuit semiconductor substrate, in accordance with this invention. A P-sub 41 is subjected to a conventional LOCOS process to form between regions of gate oxide 42 the FOX field oxide regions 43 and 43'. The gate oxide is a tunneling oxide (~100 Å) for a flash memory and is an EPROM oxide (~200 Å) for an EPROM.

Above the product of the LOCOS process, a polysilicon 1 thin film 44 is formed having a thickness of about 1,500 Å, within a range from about 500 Å to about 4,000 Å.

The polysilicon 1 thin film 44 is doped conventionally by a process such as $POCl_3$ doping or by ion implantation.

A silicon nitride layer 46 is formed by CVD on the polysilicon 1 thin film 44. Silicon nitride layer 46 has a thickness within a range from about 1,000 Å to about 5,000 Å.

Next a photoresist layer 48 is formed on the silicon nitride layer 46 and exposed to form a polysilicon 1 mask for shaping polysilicon 1 thin film 44. By exposure of the photoresist layer 48 openings 49 and 49' are formed in the photoresist layer 48.

Figure 1:
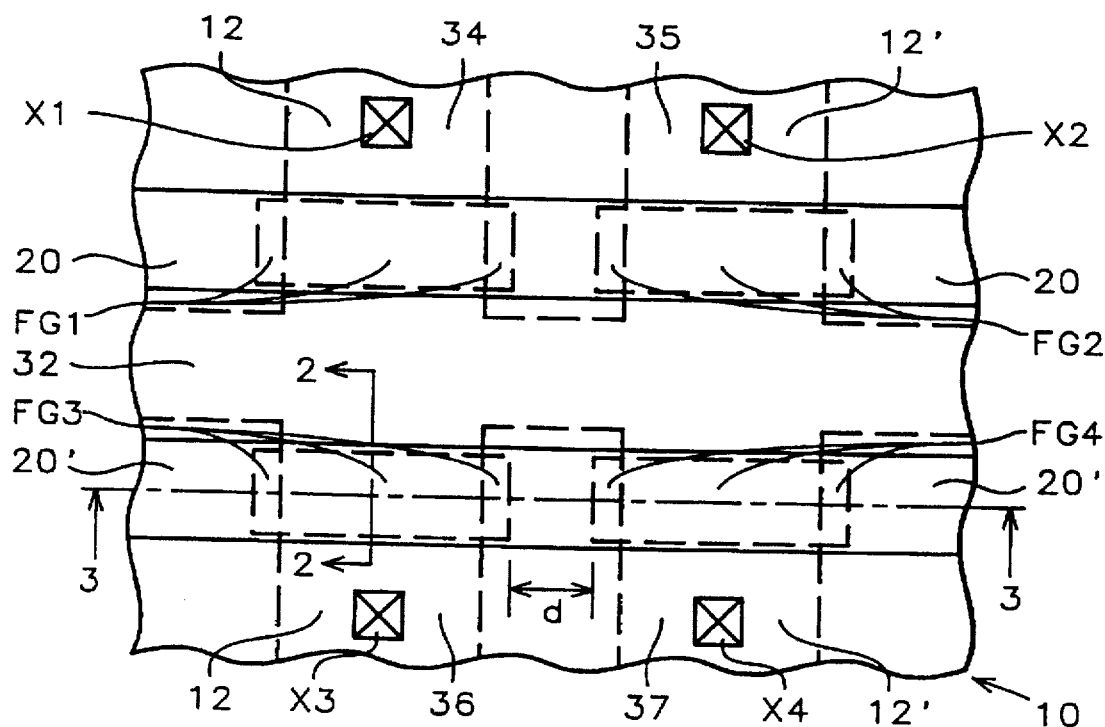
FIG. 1 is a plan view of a prior art device 10 with several polysilicon 1 floating gate lines and parallel polysilicon 2 word lines forming control gates.
Figure 2:
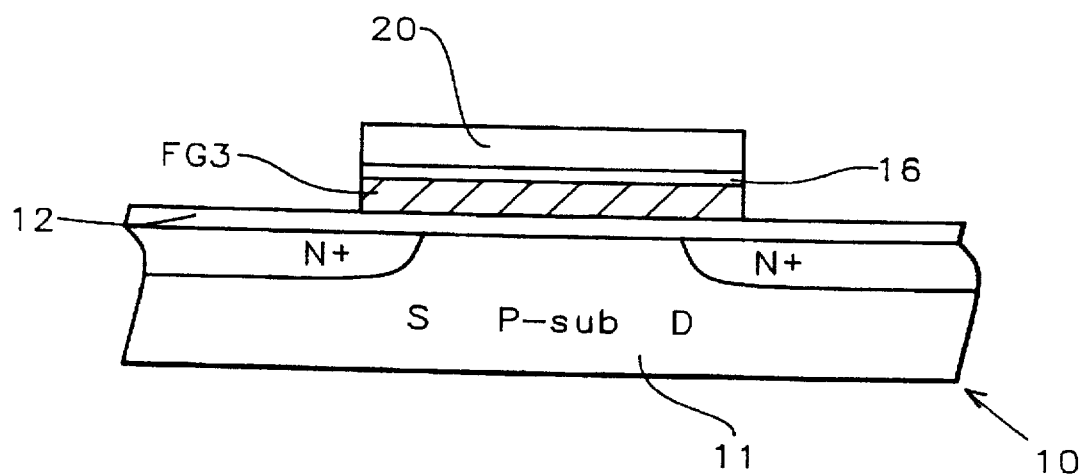
FIG. 2 shows a cross section of the prior art device of FIG. 1 taken along line 2—2 in FIG. 1.
Figure 3:
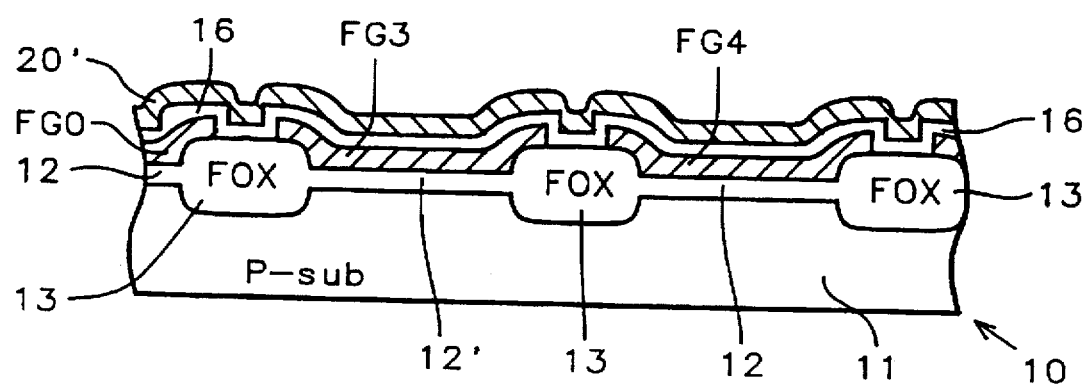
FIG. 3 shows a cross section of the device of FIG. 1 taken along line 3—3 in FIG. 1.
Figure 6:
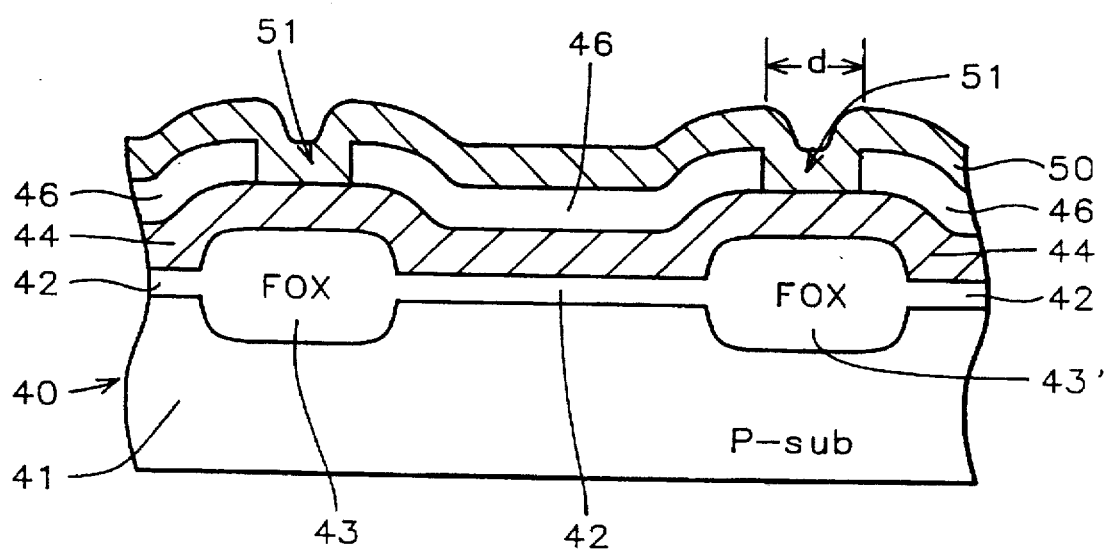
FIG. 6 shows the device of FIG. 5 after a silicon nitride layer has been etched through apertures to form openings down to a polysilicon 1 thin film.

Referring to FIG. 6, the product of FIG. 5 is shown after the silicon nitride layer 46 has been etched through the apertures 49 and 49' to form openings 51 down to the polysilicon 1 thin film 44. The openings 49 and 49' have a width of about "d", as described above in connection with FIG. 1.

Then above the silicon nitride layer 46, a polysilicon 2 thin film 50 is formed having a thickness of about 2,000 Å, within a range from about 1,000 Å to about 4,000 Å.

The polysilicon 2 thin film 50 is doped by a conventional method, e.g. ion implantation or $POCl_3$ doping.

Figure 7:
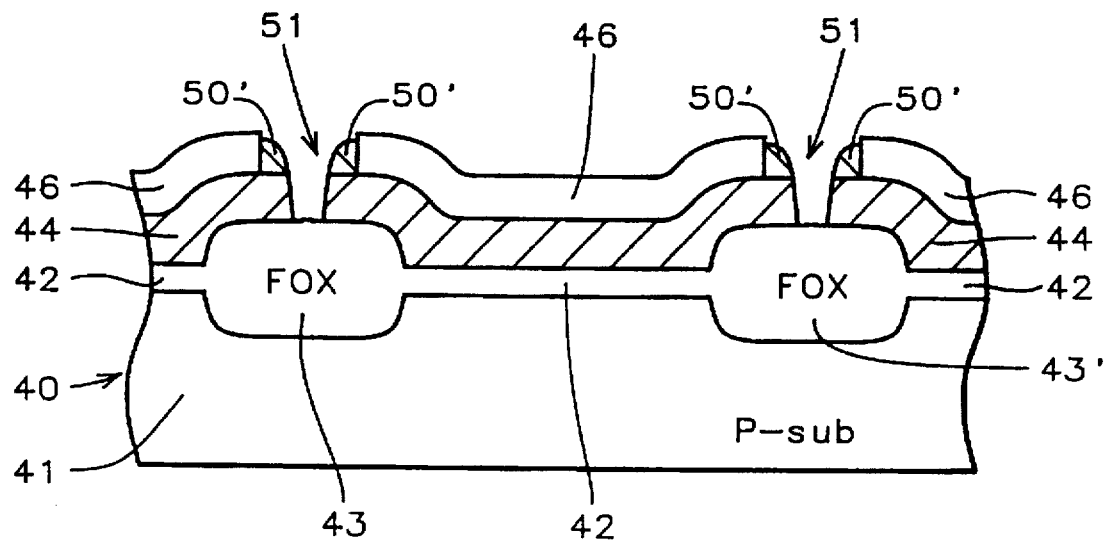
FIG. 7 shows the device of FIG. 6, after the polysilicon 2 thin film has been subjected to a self-aligned spacer etching process.

FIG. 7 shows the device of FIG. 6, after the polysilicon 2 thin film 50 has been subjected to a self-aligned spacer etching process using the RIE or plasma etching process in a plasma chamber, leaving the spacer structures 50' with openings 51 self-aligned with and extending through the spacer structures 50' down through the polysilicon 1 layer 44 to the FOX structures 43 and 43'. RIE etching can perform well to provide a deep selective etch with the aspect ratio of as illustrated in the drawing.

Figure 8:
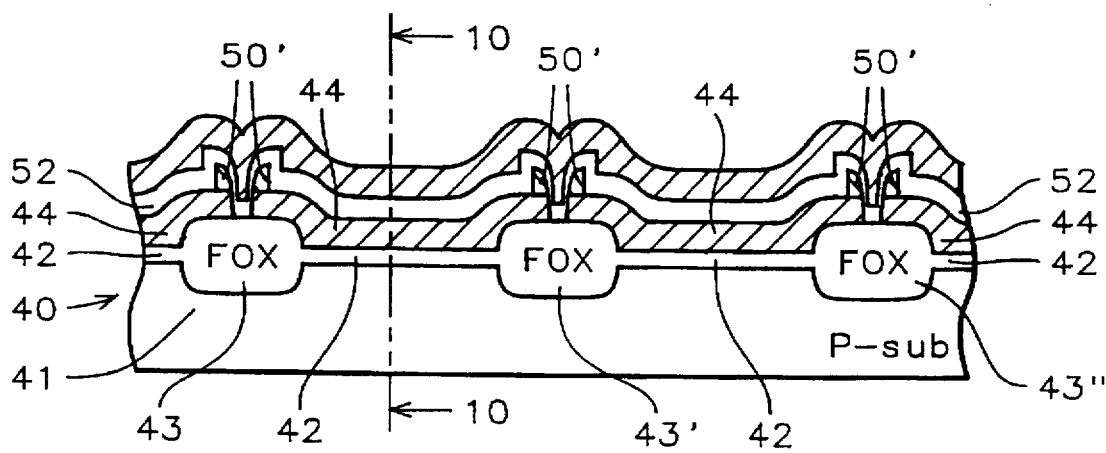
FIG. 8 shows a cross section of the device of FIGS. 7 and 9 and 10 after the silicon nitride layer has been removed.
Figure 9:
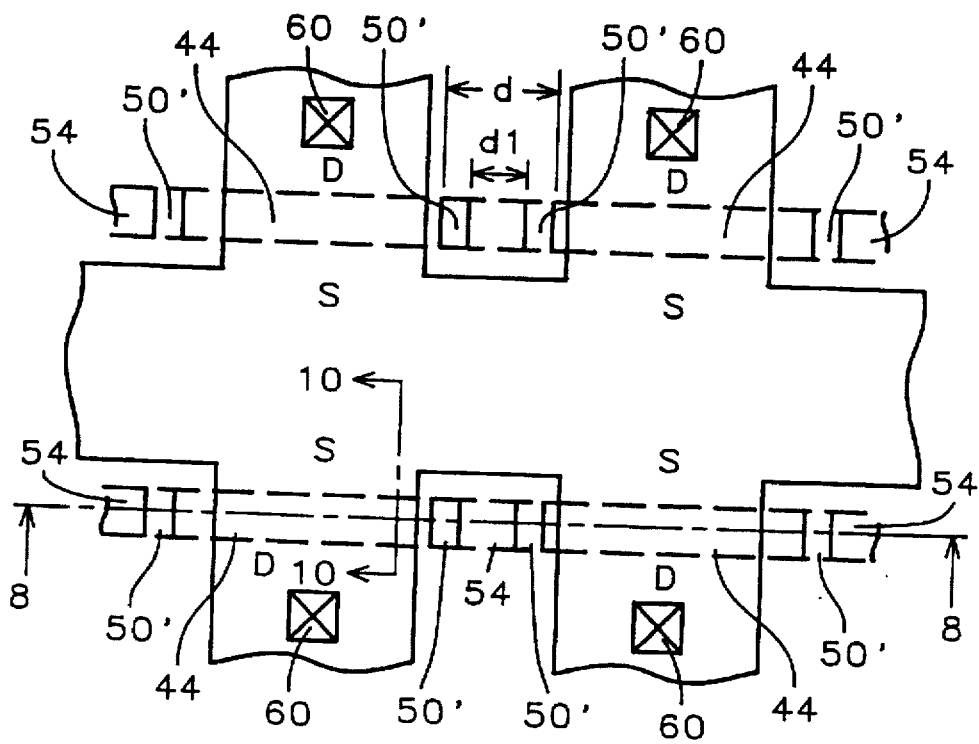
FIG. 9 shows a plan view of the device of FIG. 8.
Figure 10:
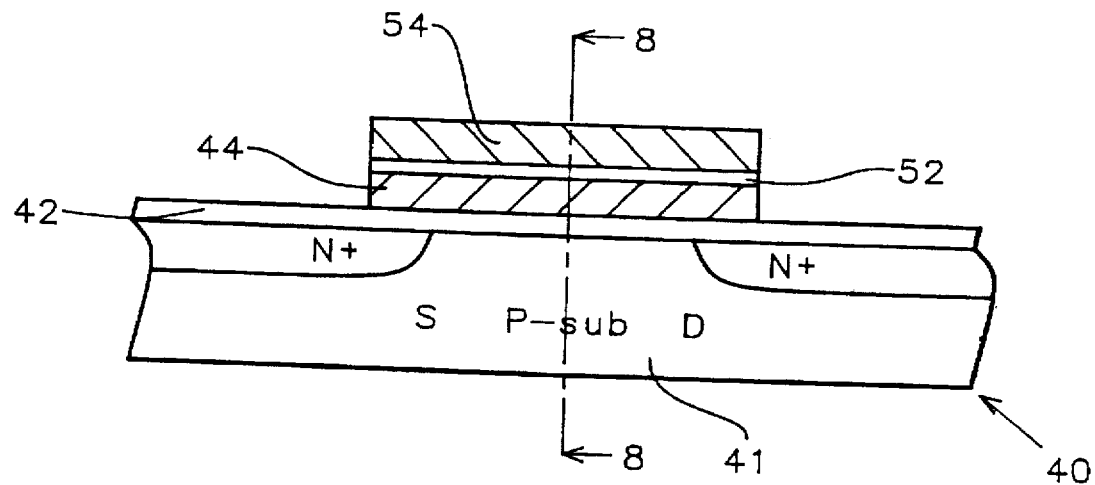
FIG. 10 shows a section of the device of FIG. 9 taken along line 10—10 in FIGS. 8 and 9.

FIG. 8 shows a cross section of the device of FIGS. 7 and 9 and 10 after the silicon nitride layer 46 has been removed. Then an interpolysilicon dielectric layer 52 has been applied over the entire surface. The interpolysilicon dielectric layer is preferably composed of a material known as ONO (oxide-nitride-oxide) having a thickness within a range from about 150 Å to about 300 Å.

Next, a polysilicon 3 word line (control gate) layer 54 has been applied to the product of FIG. 7 and formed into word lines 54. The polysilicon 3 layer needs to be patterned by photolithography and etching to form the polysilicon 3 word line. The polysilicon 1 layer is also etched by the polysilicon 3 masking along he source/drain edge to form a self-aligned stacked etch.

In FIG. 8 the source and drain locations cannot be seen because the cross-section line is along line 8—8 in FIG. 9. In FIGS. 8 and 9 the device includes P-sub 41 with a conventional gate oxide 42 the FOX regions 43, 43' and 43", polysilicon 1 thin film 44 and the polysilicon 2 thin film 50, ONO dielectric layer 52, and the word line formed by polysilicon 3 layer 54.

Note that in FIG. 8 the polysilicon 2 layer 50 extends no lower than the top surface of the polysilicon 1 layer since there was no etching process when the holes are formed in the CVD nitride layer 46.

The result of the process steps described in connection with FIG. 8 is that the floating gate of the device 40 is formed of a composite of the polysilicon 1 thin film 44 and the polysilicon 2 thin film 50, in a pattern formed by the self-aligned etching process Just described above.

The spacing between adjacent floating gates has become $d_1$ where as follows:

$$d_1 < d$$

where d is the minimum space allowable by design rule.

Therefore, by using this three polysilicon layer process, the area between the control gate layer 54 and the floating gate layers composed of polysilicon 1 layer 44 and polysilicon 2 layer 50 in the form of spacer structures 50' has been increased compared to a two polysilicon layer process. The value of $C_1$ is increased, so the coupling ratio is increased.

PIG. 9 shows a plan view of the device of FIG. 8, as a completed device. Spacer structures 50' can be seen with the gap d1 between them. FIG. 10 shows a section of the device of FIG. 9 taken along line 10—10 in PIGS. 8 and 9. As can be seen in FIG. 10, the edge of the word line 54 and floating gate layer 44 is self-aligned, so the polysilicon 3 layer 54 and polysilicon 1 layer 44 are self-aligned. The source S and drain D are formed in the P- doped substrate 41 with the channel of a transistor formed between them in the substrate 41.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A non-volatile memory device comprising:
    a substrate having first, second and third field isolation regions formed thereon;
    a first gate oxide region over the substrate between the first and second field isolation regions;
    a first floating gate electrode on the first gate oxide region, opposite ends of the first floating gate electrode positioned above the first and second field isolation regions, respectively;
    first source and drain regions within the substrate and extending between the first and second field isolation regions on either side of the first floating gate electrode;
    first and second conductive spacers connected to the first floating gate electrode and extending vertically above the first floating gate electrode and the first and second field isolation regions, wherein sides of the first and second conductive spacers are vertically aligned with the opposites edges of the first floating gate electrode positioned over the first and second field isolation regions;
    a dielectric layer covering the first floating gate electrode and the first and second conductive spacers; and
    a control electrode overlying the dielectric layer and extending over each vertically extending side of the first and second conductive spacers.

2. The memory of claim 1, wherein the first floating gate electrode comprises a first layer of polysilicon and wherein the first and second conductive spacers comprise a second layer of polysilicon formed on the first layer of polysilicon.

3. The memory of claim 2, wherein the field isolation regions are LOCOS oxide structures.

4. The memory of claim 1, further comprising:
    a second gate oxide region over the substrate between the second and third field isolation regions;
    a second floating gate electrode on the second gate oxide region;
    second source and drain regions within the substrate on either side of the second floating gate electrode; and
    second conductive spacers connected to the second floating gate electrode and extending vertically above a surface of the second floating gate electrode,
    wherein the second conductive spacers are covered by the dielectric layer and the control electrode extends above the second floating gate electrode and the second conductive spacers.

5. The memory of claim 4, wherein a first edge of the first floating gate electrode lies over the second field isolation region and wherein a first edge of the second floating gate electrode lies over the second field isolation region.

6. The memory of claim 5, wherein a first conductive spacer is adjacent the first edge of the first floating gate electrode and a second conductive spacer is adjacent the first edge of the second floating gate electrode.

7. The memory of claim 5, wherein a first conductive spacer is aligned with the first edge of the first floating gate electrode and a second conductive spacer is aligned with the first edge of the second floating gate electrode.

8. The memory of claim 7, wherein the first edge of the first floating gate electrode is separated from the first edge of the second floating gate electrode by a distance less than the design rule used for manufacturing the memory.

9. The memory of claim 5, wherein a first conductive spacer is aligned with the first edge of the first floating gate electrode and a second conductive spacer is aligned with the first edge of the second floating gate electrode, wherein the dielectric layer extends between the first edge of the first floating gate electrode and the first edge of the second floating gate electrode.

10. The memory of claim 9, wherein the control electrode extends between the first conductive spacer and the second conductive spacer.

11. The memory of claim 9, wherein the first and second conductive spacers comprise polysilicon.

* * * * *